United States Patent
Ash

(10) Patent No.: US 7,260,375 B2
(45) Date of Patent: Aug. 21, 2007

(54) FREQUENCY AGILE RF CIRCUIT

(75) Inventor: Darrell Lee Ash, Sachse, TX (US)

(73) Assignee: RF Monolithics, Inc., Dallas, TX (US)

(*) Notice: Subject to any disclaimer, the term of this patent is extended or adjusted under 35 U.S.C. 154(b) by 639 days.

(21) Appl. No.: 10/289,164

(22) Filed: Nov. 6, 2002

(65) Prior Publication Data

US 2004/0087297 A1  May 6, 2004

(51) Int. Cl.
*H04B 7/00* (2006.01)
(52) U.S. Cl. .................. 455/260; 455/253.2; 455/339; 330/306
(58) Field of Classification Search ............... 455/293, 455/341, 131, 194.1, 194.2, 212, 213, 216, 455/253.2, 255, 257, 260, 313, 314, 323, 455/338, 339; 330/51, 310, 149, 150, 306
See application file for complete search history.

(56) References Cited

U.S. PATENT DOCUMENTS

| | | | | |
|---|---|---|---|---|
| 3,886,550 A | * | 5/1975 | Gilleran et al. | 342/201 |
| 4,271,366 A | * | 6/1981 | Isayama et al. | 327/262 |
| 4,646,360 A | * | 2/1987 | Muterspaugh | 455/195.1 |
| 4,903,319 A | * | 2/1990 | Kasai et al. | 455/574 |
| 4,969,180 A | * | 11/1990 | Watterson et al. | 379/56.1 |
| 5,099,204 A | * | 3/1992 | Wheatley, III | 330/279 |
| 5,357,207 A | * | 10/1994 | Ash | 330/51 |
| 5,991,612 A | * | 11/1999 | Saito | 455/234.1 |
| 6,404,891 B1 | * | 6/2002 | Seitz et al. | 381/107 |
| 6,690,506 B2 | * | 2/2004 | Zahnley et al. | 359/337.11 |

FOREIGN PATENT DOCUMENTS

| | | |
|---|---|---|
| EP | 0 681 366 | 11/1995 |
| EP | 0 841 755 | 5/1998 |

* cited by examiner

*Primary Examiner*—Lana Le
*Assistant Examiner*—Nhan T. Le

(57) ABSTRACT

A frequency agile sequential amplifier circuit that includes first and second RF amplifiers coupled by a SAW delay line, a double balanced mixer coupling the first RF amplifier to the SAW delay line, the output of the first RF amplifier providing a signal as a first input to the double balanced mixer and a variable pulse generator coupled to both said first and second RF amplifiers to cause them to sequentially and alternately conduct, and a divide/2 circuit coupling said variable pulse generator to said double balanced mixer as a second input at ½ the rate of said RF amplifiers to cause the sequential amplifier circuit to achieve frequency agility and to substantially maintain its sensitivity.

31 Claims, 8 Drawing Sheets

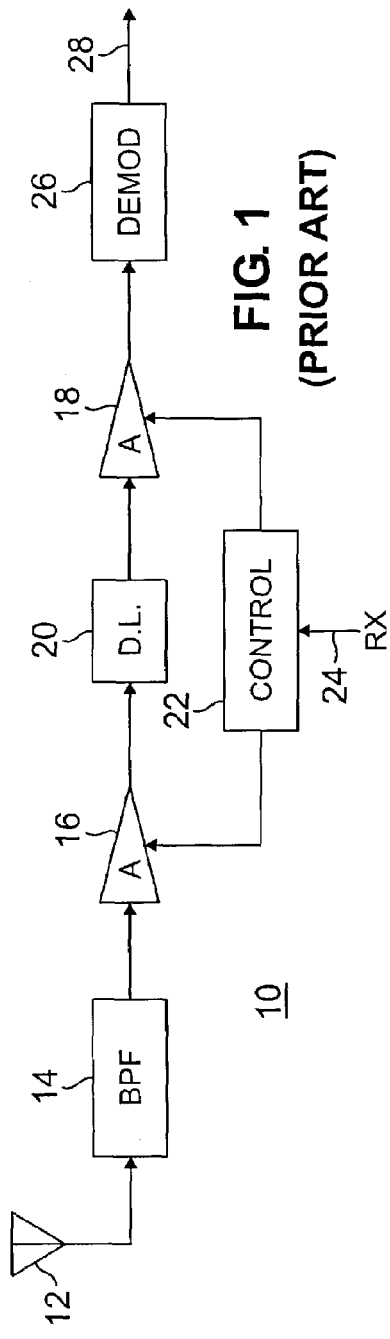
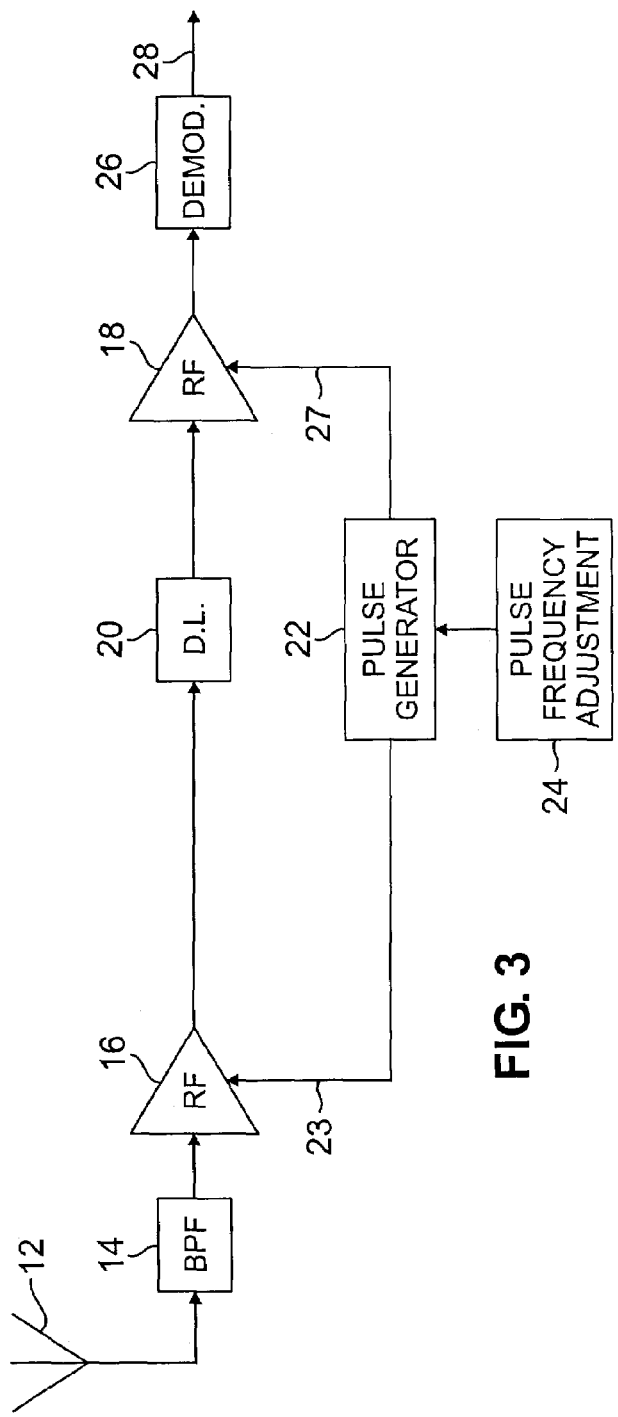
FIG. 1 (PRIOR ART)
FIG. 3

FREQUENCY AGILE RF CIRCUIT

FIELD OF THE INVENTION

The present invention relates in general to RF amplifier circuits and in particular to a sequential amplifier circuit that can be made frequency agile and that can be used to create RF Signal receivers and transmitters having multiple channel capability.

BACKGROUND OF THE INVENTION

RF amplifier circuits are old and well known in the art and are generally used in transmitter/receiver circuits. A unique RF amplifier circuit has been disclosed in commonly assigned U.S. Pat. No. 5,357,206, incorporated by reference herein in its entirety, as a novel RF receiver that utilizes sequential RF amplifiers. A further improvement of that invention is disclosed in commonly assigned U.S. Pat. No. 5,787,117, also incorporated herein by reference in its entirety, and that discloses a transceiver created by using the novel sequential RF amplifier circuits. These novel inventions have met with great success.

Such development has been used to implement a single-channel SRD radio with good performance and with a very low power budget. Single-channel radios currently address a significant number of short range device (SRD) applications including remote keyless entry (RKE), tire pressure monitoring (TPM), gate/door control, wireless security systems, radio frequency identification (RFID) tags, sports/medical telemetry, and many meter reading applications including automatic meter reading (AMR), etc. These circuits have great value because they are reliable, economical, use low power, and have significant advantages over the prior art systems.

However, some meter reading systems, all cordless phones, most PDA/laptop network radios, and a number of other applications utilize MULTI-CHANNEL, or, more generally, multi-session unlicensed radios. Multi-session radios avoid or minimize in-band interference where several uncoordinated radio systems are operating in the same vicinity. The two most commonly used multi-session strategies are frequency channelization and spread spectrum coding. Most unlicensed radio systems used with PC technology operate in the 2.4 GHz band, which is the lowest industrial, scientific, and medical (ISM) frequency band above 300 MHz that is available in all regions. Operation in the 2.4 GHz range is also particularly interesting for Japan where the alternative is very low power operation under Bijaku regulations.

It would be advantageous to be able to utilize the sequential amplifier technology to develop a frequency agile RF system that could use multi-channel or frequency hopping operation.

SUMMARY OF THE INVENTION

The present invention allows the use of low power, economical, sequential amplifier circuits to form frequency agile radio receivers and transmitters with no architectural changes being made to the basic sequential amplifier circuit.

In one embodiment, the system utilizes the first RF amplifier of the sequential RF amplifier shown and described in commonly assigned U.S. Pat. No. 5,787,117 as a mixer and the switching signal from the pulse generator (as the local oscillator) is varied to allow the reception of more than one channel frequency. The coupled resonator SAW (Surface Acoustic Wave) filter on the input from the antenna acts as a pass band filter that passes all of the frequencies of interest. The SAW delay line provides the channel isolation and has the bandwidth necessary to pass a single channel.

In the preferred embodiment, the frequency of the pulse generator is again varied to provide a variable local oscillator (LO) signal. A double balanced mixer is placed between the first RF amplifier and the SAW delay line and has as a first input the RF signal from the first RF amplifier and has ½ the variable pulse generator frequency output as the second input. The output of the mixer is the typical sum and difference frequencies common to all double balanced mixers. Either the sum or the difference frequency output from the mixer circuit can be selected by fixing the pass band of the SAW delay line appropriately and is passed through the circuit to form an RF radio receiver. This receiver is low cost since it utilizes all of the existing elements in the novel sequential amplifier circuit, adds only the double balanced mixer that can be integrated on the same chip, requires low power, has increased signal sensitivity and offers great stability due to the low frequency of the local oscillator when compared to the RF input signal frequency. A large variation in the pulse generator frequency can make little difference in the operation of the circuit since a variation of even 10% makes the sum and difference frequencies from the mixer vary very little.

Further, by adding a double balanced mixer in the transmitter circuit shown and described in commonly assigned U.S. Pat. No. 5,787,117, a frequency agile transmitter is achieved. Again, this circuit has the same advantages as the receiver circuit for the same reasons given above. The variable frequency pulse generator output is again used as one input to the double balanced mixer placed in the transmitter circuit between the 3rd and 4th RF amplifiers as shown and disclosed in commonly assigned U.S. Pat. No. 5,787,117 to which reference was made earlier.

Further the novel invention may be used as both a tracking receiver and a "frequency hopping" circuit.

Thus, it is an object of the present invention to provide a sequentially coupled RF amplifier that operates as a frequency agile receiver such that it can shift operation from one frequency band to another. It is also an object of the present invention to provide a novel frequency agile receiver that maintains its sensitivity with the use of a double balanced mixer.

It is still another object of the present invention to provide a novel sequential RF amplifier receiver/transmitter that can also be used as a frequency hopping circuit. It can also be used as a frequency tracking receiver with the use, for example only, of a SAW proximity filter (well known in the art) that has a frequency band pass narrower than the frequency band pass of the SAW delay line used in the sequential amplifier circuit disclosed in the '117 and '206 patents discussed above.

Thus, the present invention relates to a novel frequency agile sequential amplifier circuit comprising first and second series coupled RF amplifiers, a band pass filter for receiving an RF input signal and generating an output RF signal having a first predetermined frequency range that is coupled to the first RF amplifier, a double balanced mixer receiving the output signal from the first RF amplifier as a first input, a delay line coupling the double balanced mixer and the second series coupled RF amplifier, the delay line having a narrow band pass frequency range including either the sum or the difference frequency, a variable frequency pulse generator coupled to the first and second RF amplifiers for generating output control signals that sequentially turn ON and OFF both the first and second RF amplifiers at a first rate, and frequency dividing means coupling the variable frequency pulse generator control signals to the double balanced mixer as a second input for sequentially switching said double balanced mixer at one/half the rate of the first and second amplifiers to form a frequency agile circuit as well as to increase the sensitivity of the sequential amplifier circuit.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

These and other objects of the present invention will be more fully understood when taken in conjunction with the following detailed description of the drawings in which like numerals represent like elements and in which:

FIG. 1 is a schematic drawing of the prior art sequential amplifier disclosed in U.S. Pat. No. 5,357,206, commonly assigned with the present application and incorporated herein in its entirety;

FIG. 3 is a schematic drawing of a frequency agile circuit of the present invention wherein the first RF amplifier acts a mixer;

DETAILED DESCRIPTION OF THE INVENTION

FIG. 1 shows the novel sequential RF amplifier circuit disclosed and claimed in commonly assigned U.S. Pat. No. 5,357,206. In this circuit, a delay line 20 sequentially couples first RF amplifier 16 to second RF amplifier 18. A pulse control circuit 22 alternately and sequentially pulses RF amplifiers 16 and 18 such that when one of the RF amplifiers is conducting, the other is turned OFF. Such action prevents the two RF amplifiers from oscillating and provides a substantially increased power output.

Figure 2:
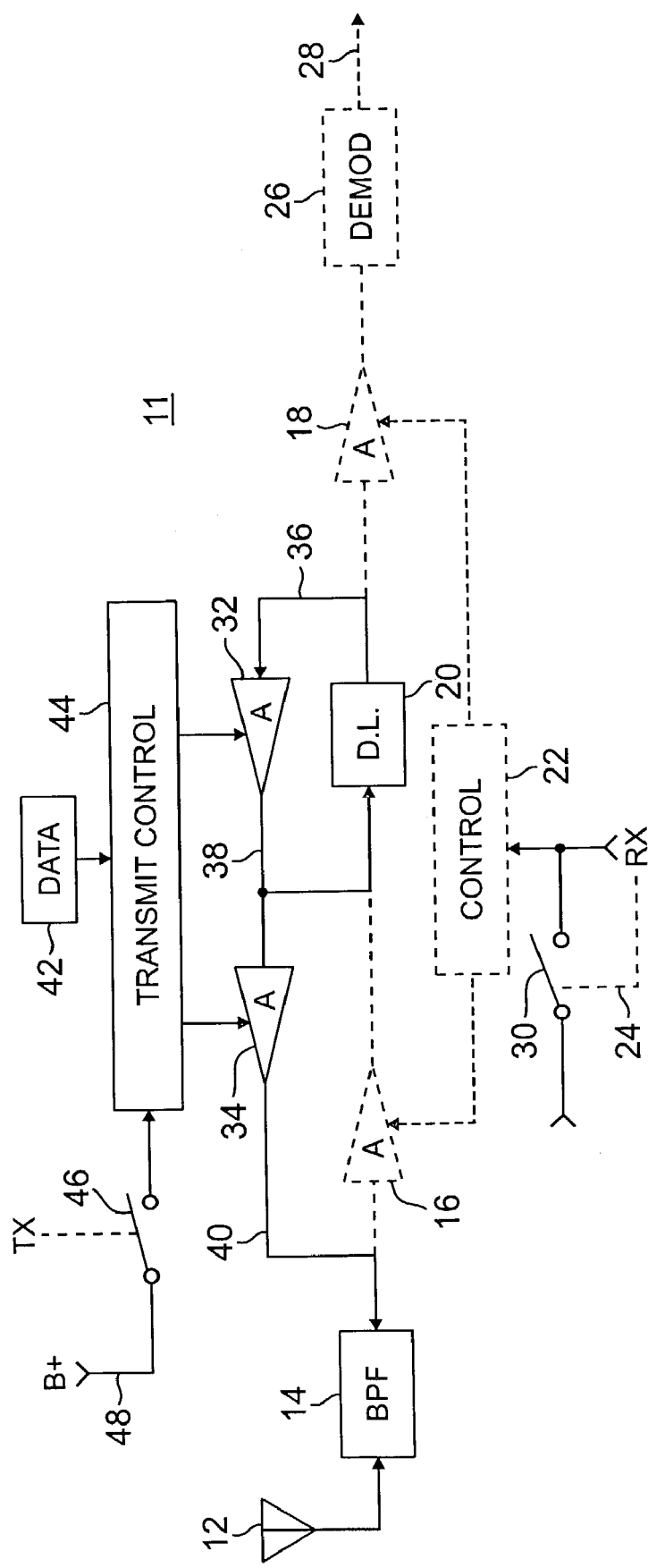
FIG. 2 is a schematic drawing of the prior art receiver/transmitter having common elements disclosed in U.S. Pat. No. 5,787,117, commonly assigned with the present application and incorporated herein in its entirety.

In FIG. 2, the prior art receiver/transmitter 11, disclosed and claimed in commonly assigned U.S. Pat. No. 5,787,117, is shown using the novel sequential RF amplifiers. When the receiver is ON, the transmitter is OFF and when the transmitter is ON, the receiver is OFF. The advantage of the sequential amplifier is that it combines elements in the receiver with elements in the transmitter such that, during transmission, certain of the elements in the receiver are used as a part of the transmitter.

FIG. 3 is a schematic diagram of a circuit using the novel sequential amplifier that has been made frequency agile. The circuit may be part of, for example, a meter reading system, a cordless phone, a PDA/laptop network radio, a cell phone, or a number of other applications that utilize multi-channel or, more generally, multi-session unlicensed radios.

The circuit in FIG. 3 is made frequency agile by coupling a pulse frequency adjustment circuit 24 to the pulse generator 22 to vary the frequency of the pulse generator 22. The frequency adjustment circuit 24 can be achieved in many ways including any well-known gate array that, for example only, selects a resistor having a certain value that determines the frequency of the pulse generator 22 that can be formed with a free-running oscillator such as an RC oscillator circuit. It matters not how it is accomplished but the important feature is that the pulse generator 22 have its frequency selectively changeable. Thus, the pulse generator 22 shown in FIG. 3 becomes a local oscillator (LO) whose frequency of operation can be changed as desired over several channel frequencies.

Figure 4:
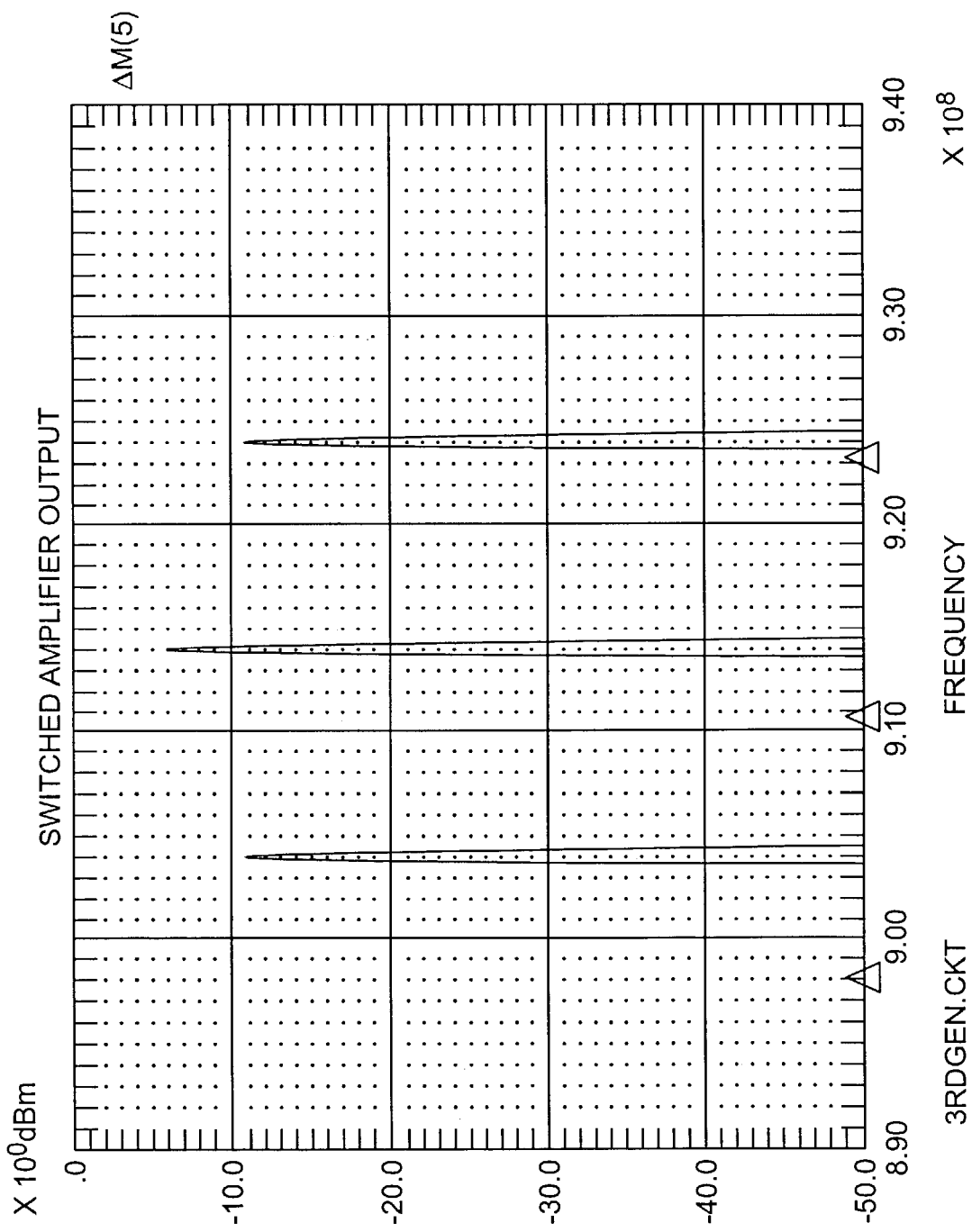
FIG. 4 is a graph illustrating the magnitude and frequency of the center frequency and upper and lower side bands obtained with the circuit of FIG. 3.

The first RF amplifier 16 acts as a mixer and produces the well-known waveform shown in FIG. 4 wherein the center frequency has the greatest magnitude as shown and wherein the upper and lower (sum and difference) sidebands are approximately 5 db lower than the center frequency. If either the sum or difference sideband is selected as the frequency of interest, it is greatly reduced in magnitude and the circuit signal sensitivity decreases.

Figure 5:
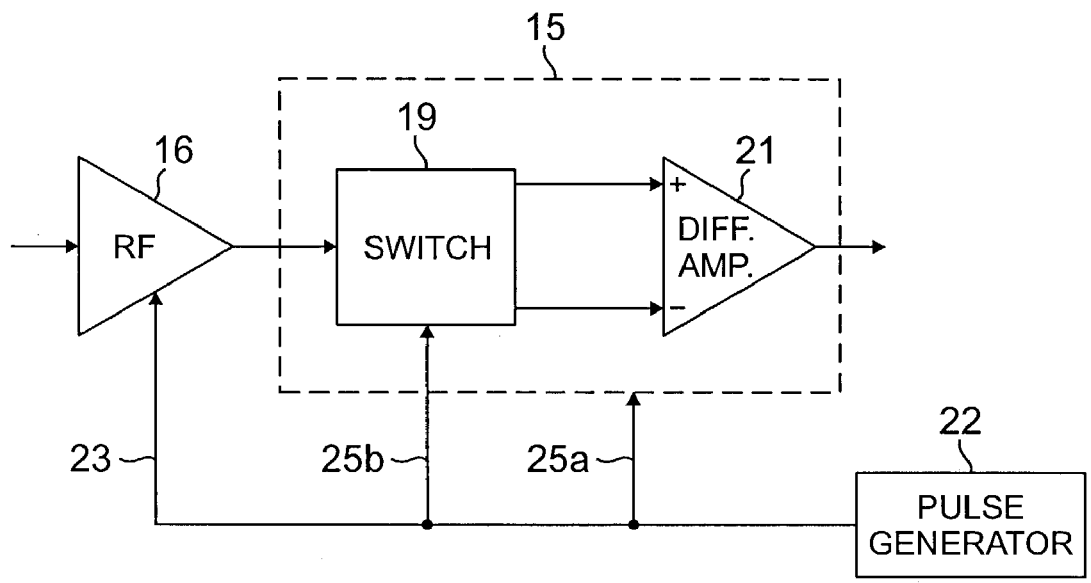
FIG. 5 is a circuit diagram of a mixer circuit that could be used in the circuit by being placed between the first RF amplifier and the delay line.

A switch unit 15 shown in FIG. 5 could also be used as the mixer. FIG. 5 is a circuit diagram of a mixer circuit that could be used in the circuit by being placed between the first RF amplifier and the delay line. The circuit depicted in FIG. 5 may be part of, for example, a meter reading system, a cordless phone, a PDA/laptop network radio, a cell phone, or a number of other applications that utilize multi-channel or multi-session unlicensed radios.

Figure 6:
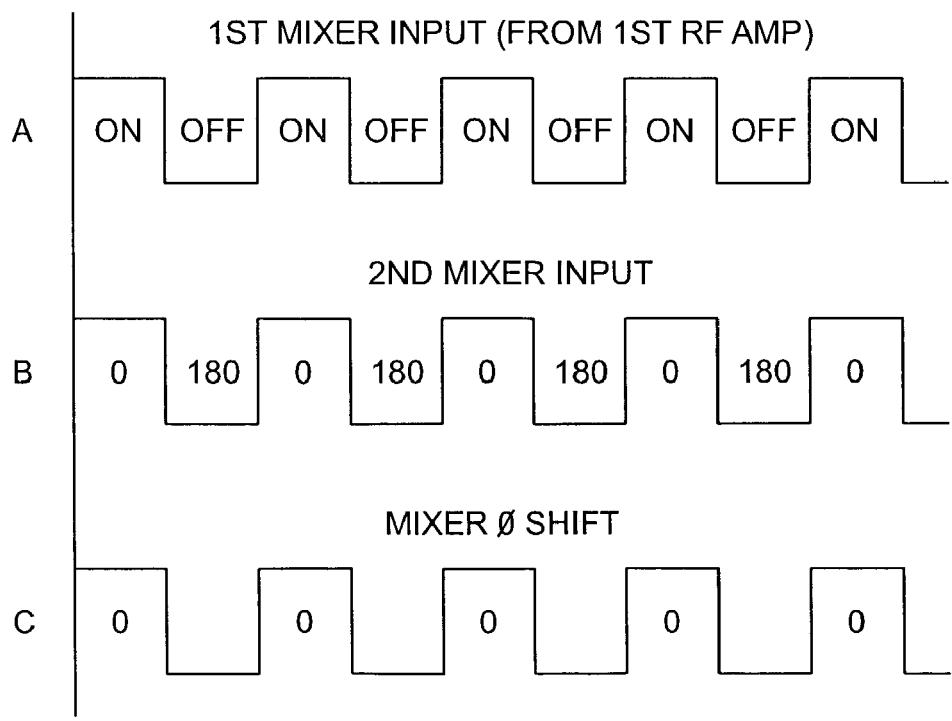
FIG. 6 is a graph of the waveforms generated by the circuits of FIGS. 3 and 5 where the mixer circuit is being switched at the same rate as the RF amplifiers.

However, it will be noted that the switch 19 is pulsed or switched at the same rate as the RF amplifier 16. The pulses on line 25a from pulse generator 22 sequence the entire switch unit 15 ON and OFF at the same rate as the $1^{st}$ and $2^{nd}$ RF amplifiers to save power. Thus, the differential amplifier 21 passes the same polarity pulse to the delay line 20 as does the embodiment shown in FIG. 3. The action of the circuit can be seen by considering FIG. 6. The pulses A are the first input pulses to the switch unit 15 from the $1^{st}$ RF amplifier 16. The pulses B are the $2^{nd}$ input pulses to the switch unit 15 from the pulse generator 22. The pulses C represent the phase shift of the pulses output from the switch unit 15. It will be noted that for every pulse from the pulse generator 22 that is used to switch the switch 19 in FIG. 5, or to switch RF amplifier 16 in FIG. 3, only one phase (the same phase) of the switch unit 15 (or RF amplifier 16) is transferred to the delay line 20. Both phases, 0° and 180°, must be present at the switch unit 15 output for balance. As a result, the circuit is not a double balanced mixer and thus provides the well known output shown in FIG. 4 having the center frequency and the sum and the difference frequencies However, frequency agility has been obtained by using the pulse generator as a Local Oscillator (LO) coupled to the RF amplifier 16 (or switch unit 15 in FIG. 5). More than one channel can be received. However, as seen in FIG. 4, receiver sensitivity has decreased 5 db from the magnitude of the center frequency. The Band Pass Filter 14 is wide enough to pass all of the frequencies of interest, such as, for example only, 914 MHz. The SAW delay line provides the channel isolation and has the bandwidth to pass a single channel of, for example only, 916.5 MHz. In one test, the receiver was set up with a post detection base bandwidth of 5 KHz. The input signal from the antenna 12 was ON-OFF-KEY (OOK) modulated with a 500 Hz square wave. A −90 dBM input to the receiver was measured as the sensitivity level (with a $10^{-4}$ bit error rate). This proved that the switched first RF amplifier was providing the mixing action necessary to translate the 914 MHz signal to 916.5 MHz passed by the SAW delay line 20. The value of a pulse rate setting resistor (representing pulse frequency adjustment circuit 24) coupled to the pulse generator 22 was calculated and found to be close enough to provide the proper LO frequency within 50 KHz.

However, as stated earlier, such circuit, while having frequency agility, loses some of its signal sensitivity since the upper (and lower) sidebands that are created lose about 4 db signal strength. Compare FIG. 4 with FIG. 9.

Figure 7:
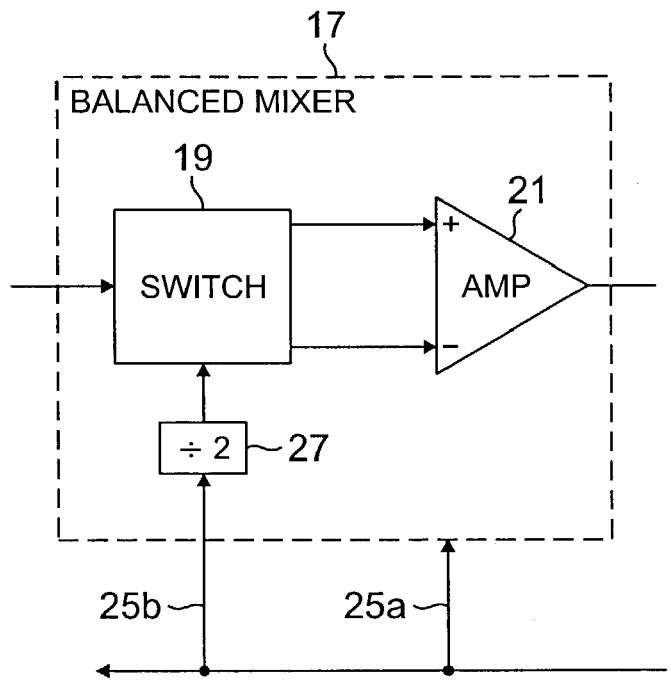
FIG. 7 is a circuit of a double balanced mixer that can be used to increase the sensitivity of the frequency agile circuit.
Figure 8:
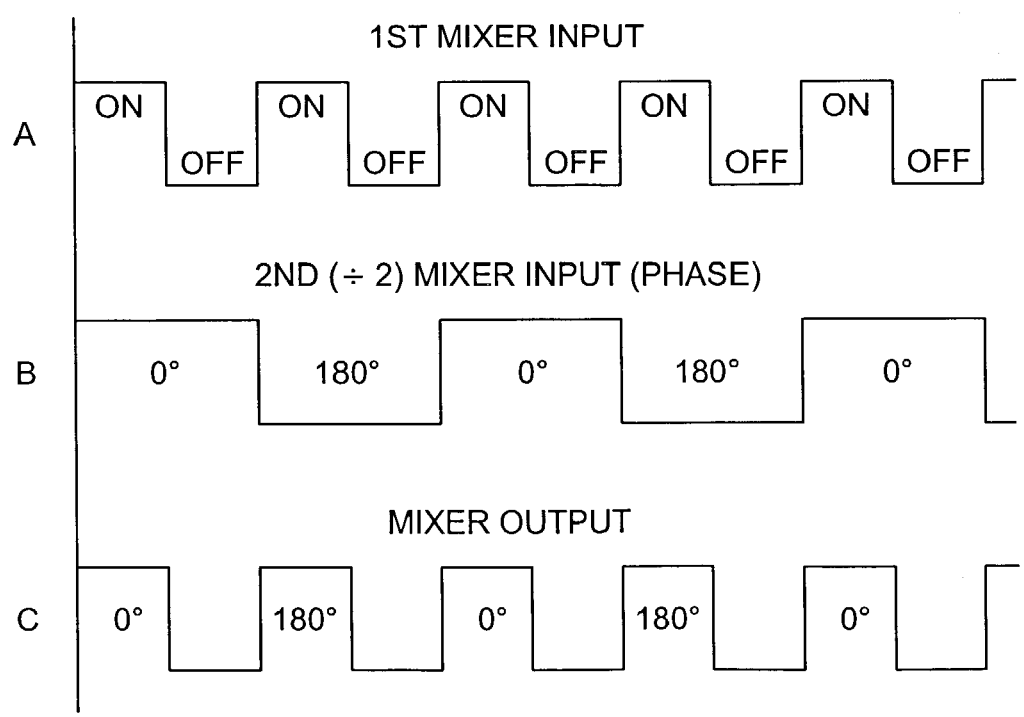
FIG. 8 is a graph of the waveforms coupled as inputs to, and the output from, the double balanced mixer of FIG. 7.
Figure 9:
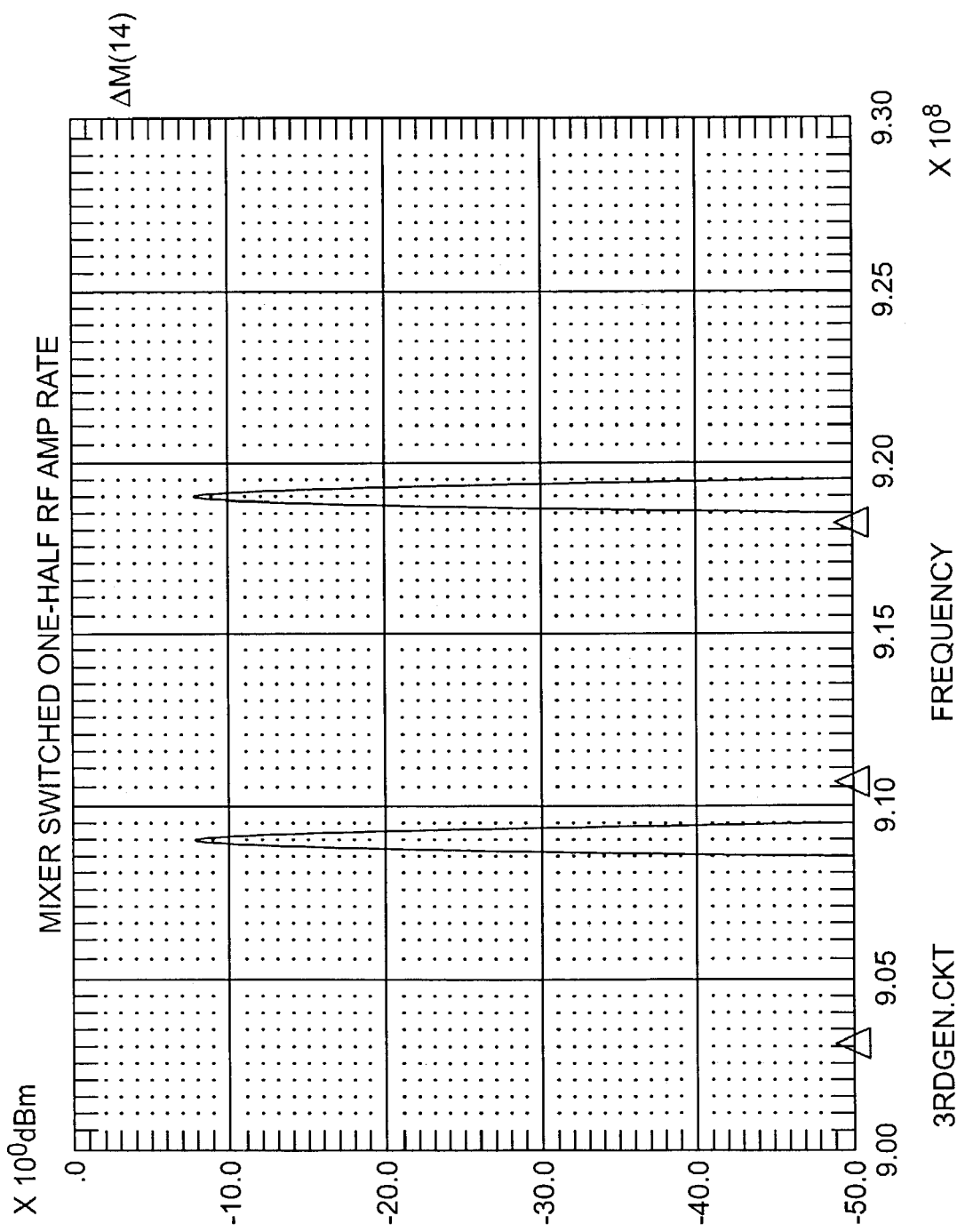
FIG. 9 is a graph illustrating the increased magnitude upper and lower side bands generated by the double balanced mixer.

In order to overcome this limitation in the preferred embodiment, the circuit of FIG. 7 is, for example only, formed as a double balanced mixer. The double balanced mixer may be part of, for example, a meter reading system, a cordless phone, a PDA/laptop network radio, a cell phone, or the like. The pulses on line 25a provide the same function as described in reference to FIG. 5. It will be noted that the pulse connection 25b is coupled to a divide/2 circuit 27 that causes switch 19 to switch at ½ the rate that the $1^{st}$ and $2^{nd}$ RF amplifiers 16 and 18 are switched. By observing FIG. 8, it will be seen that because double balanced mixer 17 is switched at ½ the switching rate of RF amplifiers 16 and 18, differential amplifier 21 receives both its + and − inputs (phases) from switch 19. See waveform C in FIG. 8. As can be seen in FIG. 8, when $1^{st}$ RF amplifier 16 is conducting, or ON, the "+", or "0° phase", is the second input to the double balanced mixer 17. When the $1^{st}$ RF amplifier 16 is turned OFF, the second input to the double balanced mixer 17 is still 0° but there is no change in the output of double balanced mixer 17. When $1^{st}$ RF amplifier 16 conducts again, the second input to the double balanced mixer 17 is now 180° and appears as the double balanced mixer 17 output. Thus, the double balanced mixer 17 produces the well-known sum and difference frequency outputs as shown in FIG. 9. It will be noted that these sum and difference signals have a 4 db gain over the sum and difference signals shown in FIG. 4. Thus, the circuit is not only frequency agile but also has substantially maintained its signal sensitivity.

This circuit has many advantages over the prior art. First, the pulse generator 22 (or Local Oscillator) has a frequency so low, from about 1 MHz to about 20 MHz, that a deviation error of as much as 10% would not adversely affect the performance of the circuit because the delay line filter 20 has a 3 dB bandwidth in the range of about 700 KHz to about 3 MHz wide. Thus there can be a high percentage inaccuracy or error in the pulse generator 22 frequency and the circuit will still operate properly because the sum (or difference) frequency is still within the pass band of the delay line 20.

Second, the frequency agility is obtained simply by adding a balanced mixer to the sequential amplifier architecture. Therefore, current consumption is still very low with the same number of equivalent current consuming components with the same physical size and with ultra low LO radiation.

Third, the frequency of the receiver can be changed by changing the value of a pulse rate resistor that can be connected between the proper pin of pulse generator 22 and ground. A simple gate can quickly change the pulse rate resistor value by selecting another resistor.

Fourth, the receiver can be used in the frequency "hop" mode and is not hampered by the settling time of a frequency synthesizer as used in the prior art. Frequency "hopping" in this circuit is very fast because it is determined by the time required to change the frequency of the RC oscillator in the pulse generator, and, as seen earlier, could easily be accomplished by a simple gate circuit that couples a different value resistor to ground to change the frequency of an RC oscillator in the pulse generator 22.

Figure 10:
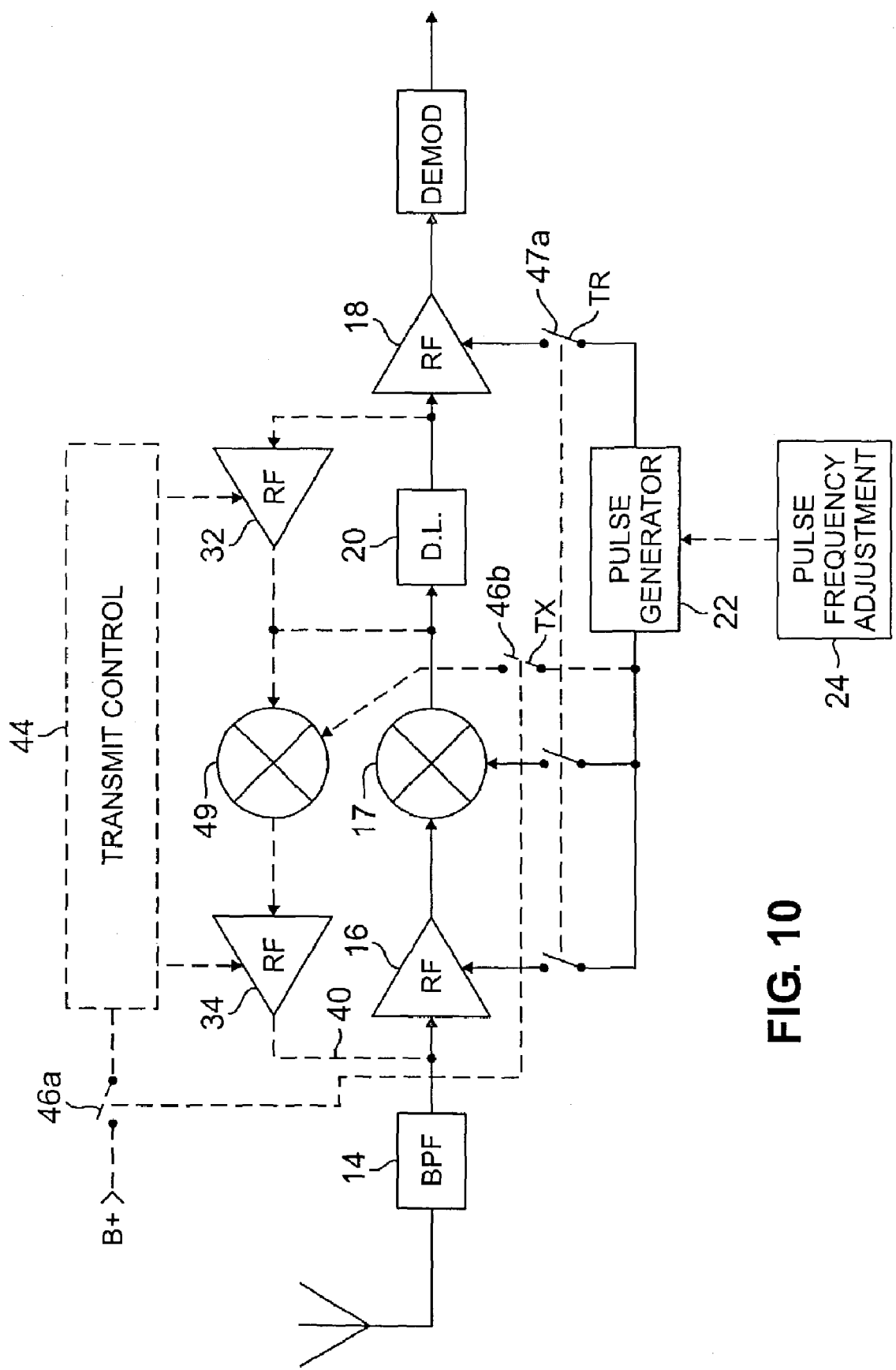
FIG. 10 is a circuit diagram illustrating the novel frequency agile receiver/transmitter.

The novel frequency agile receiver can be easily made into a frequency agile receiver/transmitter by a simple modification of the circuit shown in commonly assigned U.S. Pat. No. 5,787,117. The circuit shown in FIG. 10 herein is identical to that shown in the '117 patent except that the output of the variable frequency pulse generator 22 is connected not only to balanced mixer 17 (that includes the divide/2 circuit) but also to double balanced mixer 49 (that includes the divide/2 circuit) in the transmit circuit when the circuit is placed in the transmit mode by ganged switch 46a and 46b in the closed position and triple ganged switch 47a being in the open position. Of course the reverse is true when the circuit is in the receive mode. In such case, ganged switch 46a and 46b is open, thus removing any power to the transmitter circuit and triple ganged switch 47a is closed thus providing power to the receiver only. It will be remembered that $3^{rd}$ RF amplifier 32 and SAW delay line 20 form an oscillator that generates the RF carrier frequency that is modulated by transmit control circuit 44. The double balanced mixer 49 is like the double balanced mixer in FIG. 7 with the divide/2 circuit included. Thus it is shown with only one input from the pulse generator 22. Mixer 49 has the RF carrier frequency as a first input and the output of the pulse generator 22 as a second input as a Local Oscillator (LO) to convert the RF carrier frequency to the desired transmitter frequency and to suppress the carrier itself. The band pass filter 14 removes the unwanted mixer side bands.

The $4^{th}$ RF amplifier could be switched to perform the same conversion, but with less efficiency as explained earlier with respect to FIG. 1.

Figure 11:
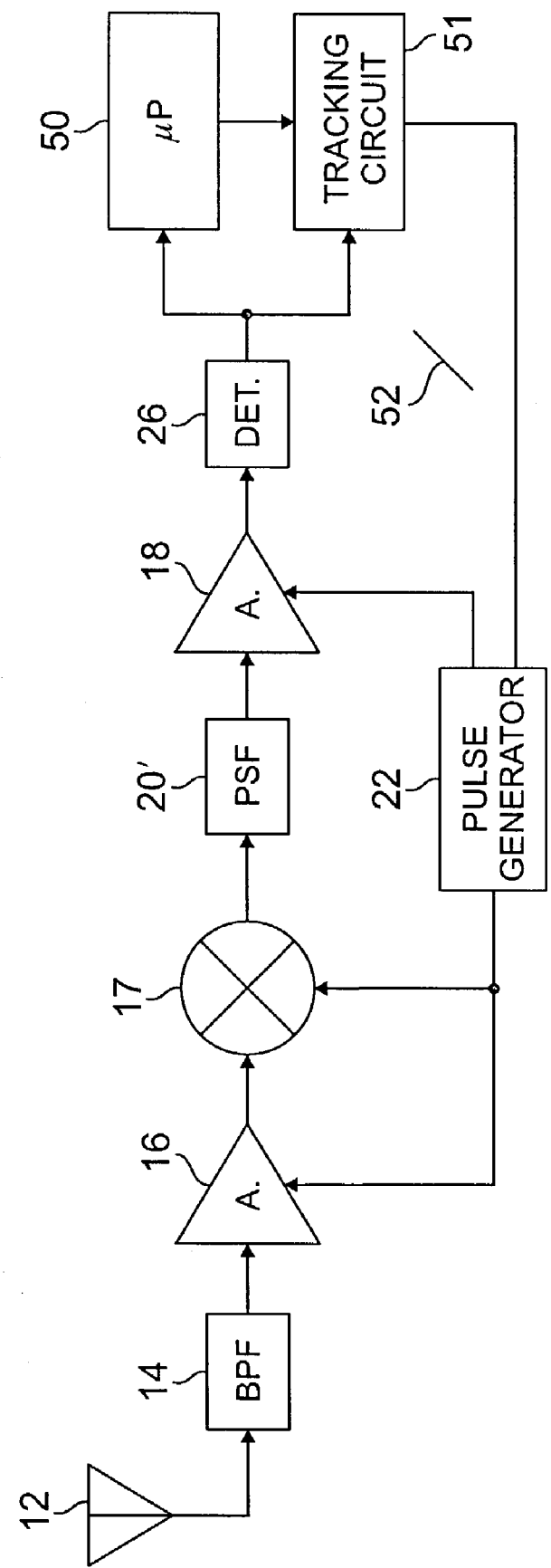
FIG. 11 is a circuit diagram of a frequency tracking receiver using the present invention.

The novel inventive circuit can also be used as a frequency tracking circuit as shown in FIG. 11. This circuit includes a microprocessor 50 and tracking circuit 51. In operation, to track a particular frequency, the tracking circuit 51 produces a signal such as a ramp voltage 52. By applying this ramped voltage to the local oscillator (pulse generator 22), the output of the mixer 17 is a changing or scanning frequency. For example only, a proximity filter 20' can be used in place of the delay line 20 as is well known in the SAW art. It has a narrow pass band for improving frequency selectivity in the range of about 50 KHz to about 500 KHz depending upon the center frequency. When the proper frequency to be tracked is identified by the microprocessor 50, it commands the tracking circuit 51 to stop its scan. Thus, the frequency desired to be tracked is locked in a "feedback loop" and is then "tracked" by the novel circuit shown in FIG. 11.

All of these circuits provide up to 10 mW of transmitter power. Higher transmitter power is one of the most sought after features in these applications set forth above.

Thus, there has been disclosed a novel improved sequential amplifier circuit that is both frequency agile and substantially maintains its signal sensitivity. These novel features are obtained by using a variable frequency pulse generator to obtain the frequency agility and a double balanced mixer to substantially maintain signal sensitivity.

Frequency hopping can be accomplished by using a circuit to gate different value resistors to the pulse generator to abruptly shift the frequency output of the sequential amplifier circuit.

Finally, a tracking receiver can be obtained with the novel circuitry by adding, for example only, a proximity SAW filter and a microprocessor and tracking circuit. The tracking circuit causes the pulse generator to change output pulse frequency in a linear fashion. When the correct frequency is output from the mixer, the microprocessor detects the frequency and causes the tracking circuit to "lock on" to the correct frequency by stopping the change in frequency of the pulse generator in a "feedback" loop. Tracking receivers, in general, are well known in the art.

Each of the above circuits utilizes the advantages of the sequential amplifier circuit to achieve its goal.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

What is claimed is:

1. A frequency agile sequential amplifier circuit comprising:
    a band pass filter operable to receive a radio frequency (RF) input signal and to generate an RF output signal, the band pass filter having a frequency range;
    first and second RF amplifiers, said first RF amplifier operable to receive said RF output signal from said band pass filter;
    a double balanced mixer operable to receive an output signal from said first RF amplifier as a first input;
    a delay line coupling said double balanced mixer and said second RF amplifier, said delay line having a band pass frequency range smaller than said frequency range of the band pass filter;
    a variable frequency pulse generator coupled to said first and second RF amplifiers and operable to generate output control signals that sequentially turn ON and OFF both said first and second RF amplifiers at a rate; and
    a frequency divider coupling at least one of said output control signals to said double balanced mixer as a second input and operable to sequentially switch said double balanced mixer at one-half the rate of the first and second RF amplifiers.

2. The frequency agile sequential amplifier circuit of claim 1 wherein:
    said double balanced mixer is operable to suppress an RF carrier frequency and to generate substantially only two spaced apart frequency side bands.

3. The frequency agile sequential amplifier circuit of claim 2 wherein:
    said delay line is a surface acoustic wave (SAW) delay line; and
    said band pass filter is a SAW filter.

4. The frequency agile sequential amplifier circuit of claim 3 wherein said SAW delay line has a pass band that includes one of the frequency side bands generated by said double balanced mixer.

5. The frequency agile sequential amplifier circuit of claim 4 wherein said SAW delay line has a bandwidth in a range from about 700 KHz to about 3 MHz.

6. The frequency agile sequential amplifier circuit of claim 5 wherein the variable frequency pulse generator is operable to act as a tunable, low frequency local oscillator (LO).

7. The frequency agile sequential amplifier circuit of claim 6 wherein:
    said local oscillator is a free-running oscillator; and
    said local oscillator is operable to operate in a lower frequency range with respect to a frequency of said SAW delay line.

8. The frequency agile sequential amplifier circuit of claim 6 wherein a frequency of said local oscillator is in a frequency range such that a frequency variation of at least 10% can be accommodated without adversely affecting operation of the circuit.

9. The frequency agile sequential amplifier circuit of claim 8 wherein a frequency of said RF input signal is in a GHz range.

10. The frequency agile sequential amplifier circuit of claim 1 wherein said double balanced mixer comprises:
    a switch operable to receive said output signal from said first RF amplifier as a first input and having first and second outputs, an output of the frequency divider being coupled to said switch as a second input to cause said switch to switch at one-half the rate of said first and second RF amplifiers; and
    a differential amplifier operable to receive the first and second outputs of said switch and having an output coupled to said delay line.

11. The frequency agile sequential amplifier circuit of claim 10 wherein the frequency divider comprises:
    a divide-by-two circuit operable to receive at least one of said output control signals and to provide a divided output control signal to said switch as said second input such that said switch is switched at one-half the rate that the first and second RF amplifiers are switched.

12. The frequency agile sequential amplifier circuit of claim 1 wherein the delay line comprises a narrow pass band filter having a range of about 50 KHz to about 500 KHz, and further comprising:
    a detector operable to detect a signal output from said second RF amplifier;
    a microprocessor operable to identify said signal output from the second RF amplifier and to select a desired frequency to be tracked; and
    a tracking circuit coupled between said microprocessor and said pulse generator and operable to cause said pulse generator to produce output control signals having a variable output frequency, said microprocessor operable to identify the desired frequency to be tracked in the signal output from said second RF amplifier and to cause said tracking circuit to stop said pulse generator from generating said output control signals having the variable output frequency.

13. The frequency agile sequential amplifier circuit of claim 1 further comprising:
a received modulated RF carrier signal coupled as an input to said band pass filter;
a demodulator operable to demodulate an output signal from the second RF amplifier to produce a demodulated signal; and
an output amplifier coupled to said demodulator and operable to amplify said demodulated signal.

14. The frequency agile sequential amplifier circuit of claim 13 further comprising:
a transmitting circuit comprising:
third and fourth RF amplifiers, the third RF amplifier coupled across the delay line to form a transmitter oscillator operable to generate an RF carrier signal;
a second balanced mixer coupled between said third and fourth RF amplifiers with an output of said third amplifier being coupled as a first input to said second balanced mixer;
a divide-by-two circuit coupled to said second balanced mixer as a second input, at least one of said output control signals from said variable frequency pulse generator coupled to said divide-by-two circuit to cause a frequency of the RF carrier signal to be converted to a signal at a desired operating frequency;
a transmit control circuit coupled to said third and fourth RF amplifiers and operable to enable said frequency converted signal to be modulated with transmission data; and
a transmit/receive switch operable to selectively enable reception and transmission of modulated RF carrier signals.

15. The frequency agile sequential amplifier circuit of claim 1 further comprising:
a conductor operable to couple at least one of said output control signals from said variable frequency pulse generator to said double balanced mixer to switch said double balanced mixer ON and OFF at the same rate as said first and second RF amplifiers to save power.

16. The frequency agile sequential amplifier circuit of claim 1, wherein the variable frequency pulse generator is operable to generate the output control signals such that when one of the RF amplifiers is turned ON the other of the RF amplifiers is turned OFF.

17. A method of forming a frequency agile sequential amplifier circuit comprising the steps of:
coupling first and second RF amplifiers in series with a delay line;
coupling an RF input signal to said first RF amplifier;
placing a double balanced mixer between the first RF amplifier and the delay line so as to receive an output of the first RF amplifier as a first input at the double balanced mixer;
generating output control signals that sequentially turn ON and OFF both said first and second RF amplifiers;
dividing at least one of the output control signals by two and providing the divided output control signal as a second input to the double balanced mixer for sequentially switching the double balanced mixer at one-half a rate of the first and second RF amplifiers; and
varying a frequency of said output control signals to cause said first RF amplifier to act as a mixer.

18. The method of claim 17, wherein coupling the RF input signal to the first RF amplifier comprises coupling an output of a band pass filter to an input of the first RF amplifier.

19. The method of claim 18, wherein:
the band pass filter has a frequency range; and
the delay line has a band pass frequency range smaller than the frequency range of the band pass filter.

20. The method of claim 17, further comprising suppressing an RF carrier frequency and generating substantially only two spaced apart frequency side bands using the double balanced mixer.

21. The method of claim 17, wherein generating the output control signals comprises generating the output control signals such that when one of the RF amplifiers is turned ON the other of the RF amplifiers is turned OFF.

22. The radio frequency receiver of claim 21, further comprising:
a transmitting circuit comprising:
third and fourth RF amplifiers, the third RF amplifier coupled across the delay line to form a transmitter oscillator operable to generate an RF carrier frequency to be transmitted;
a second balanced mixer coupled between the third and fourth RF amplifiers, an output of the third amplifier coupled as a first input to the second balanced mixer;
a divide-by-two circuit coupled to the second balanced mixer as a second input, the variable frequency pulse generator having an output signal coupled to the divide-by-two circuit to cause the frequency of the transmitter oscillator to be converted to a signal at a desired operating frequency; and
a transmit control circuit coupled to the third and fourth RF amplifiers and operable to enable the frequency converted signal to be modulated with transmission data; and
a transmit/receive switch operable to selectively enable transmission and reception of modulated RF carrier signals.

23. A radio frequency (RF) receiver comprising:
a frequency agile sequential amplifier circuit comprising:
a band pass filter operable to receive an RF input signal and to generate a filtered RF signal, the band pass filter having a frequency range;
first and second RF amplifiers, said first RF amplifier operable to receive said filtered RF signal from said band pass filter;
a double balanced mixer operable to receive an output signal from said first RF amplifier as a first input;
a delay line coupling said double balanced mixer and said second RF amplifier, said delay line having a band pass frequency range smaller than said frequency range of the band pass filter;
a variable frequency pulse generator coupled to said first and second RF amplifiers and operable to generate output control signals that sequentially turn ON and OFF both said first and second RF amplifiers at a rate; and
a frequency divider coupling at least one of said output control signals to said double balanced mixer as a second input and operable to sequentially switch said double balanced mixer at one-half the rate of the first and second RF amplifiers.

24. The radio frequency (RF) receiver of claim 23 wherein:
said double balanced mixer is operable to suppress an RF carrier frequency and to generate substantially only two spaced apart frequency side bands.

25. The radio frequency (RF) receiver of claim 24 wherein:
said delay line is a surface acoustic wave (SAW) delay line; and
said band pass filter is a SAW filter.

26. The radio frequency (RF) receiver of claim 25 wherein said SAW delay line has a pass band that includes one of the frequency side bands generated by said double balanced mixer.

27. The radio frequency (RF) receiver of claim 24 wherein said RF receiver is disposed in a cordless telephone.

28. The radio frequency (RF) receiver of claim 24 wherein said RF receiver is disposed in a cellular telephone.

29. The radio frequency (RF) receiver of claim 24 wherein said RF receiver is disposed in a wireless network card suitable for accessing a wireless local area network (LAN).

30. The radio frequency receiver of claim 23, further comprising:
a microprocessor operable to identify an output frequency of an output signal from the sequential amplifier circuit; and
a tracking circuit coupled between the microprocessor and the pulse generator and operable to cause the pulse generator to produce a variable output frequency, which is operable to cause the sequential amplifier circuit to generate a variable frequency output signal, the microprocessor operable to identify a desired frequency to be tracked in the output signal from the sequential amplifier circuit and to cause the tracking circuit to stop the pulse generator from generating the variable frequency output signal.

31. The radio frequency receiver of claim 23, further comprising:
a demodulator coupled to an output of the sequential amplifier circuit and operable to demodulate a signal output from the sequential amplifier circuit; and
an output amplifier coupled to the demodulator and operable to amplify the demodulated signal.

* * * * *